April 11, 1967 J. W. TAYLOR, JR., ETAL 3,314,018
DETECTOR-LINE DRIVE WITH INPUT TUNING AND FEEDBACK MEANS
Filed June 3, 1964
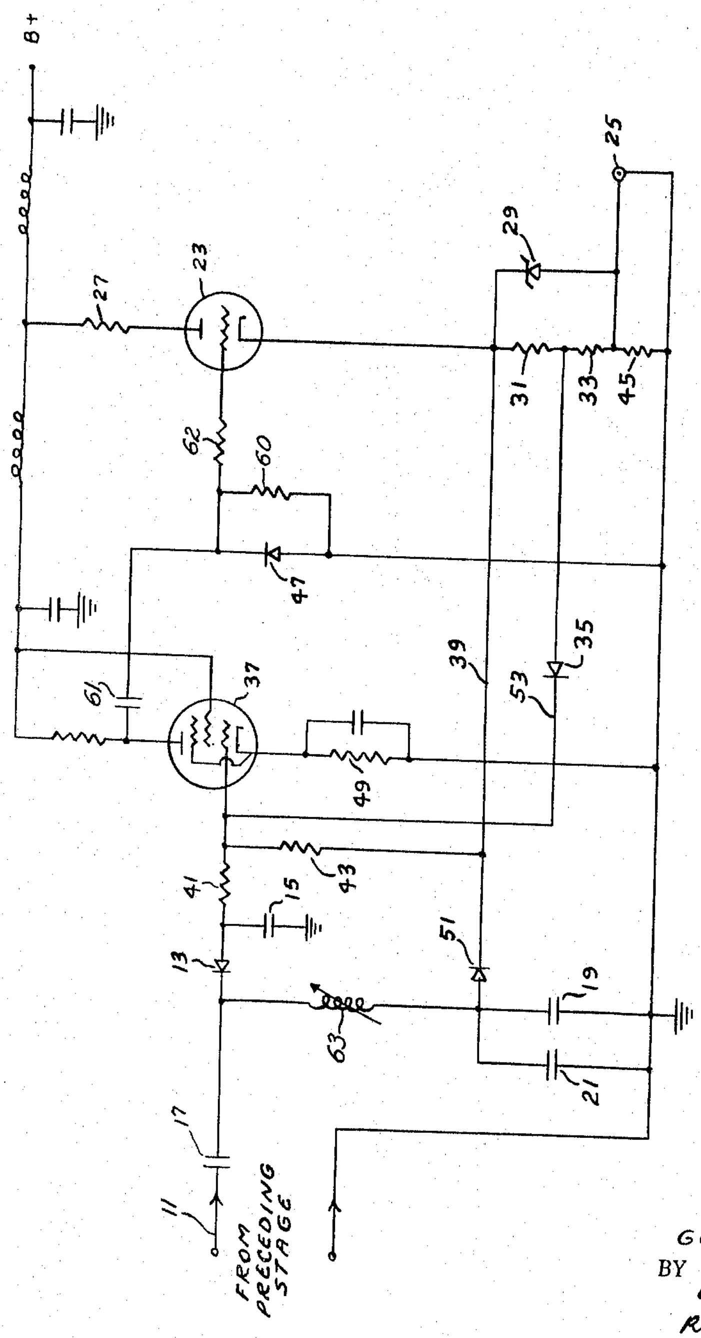
INVENTORS
JOHN W. TAYLOR, JR.
GORDON W. AMATO
BY Wade Koontz and Robert Kern Duncan
ATTORNEYS

3,314,018
DETECTOR-LINE DRIVE WITH INPUT TUNING AND FEEDBACK MEANS

John W. Taylor, Jr., Baltimore, and Gordon W. Amato, Clarksville, Md., assignors, by mesne assignments, to the United States of America as represented by the Secretary of the Air Force Filed June 3, 1964, Ser. No. 372,421
1 Claim. (Cl. 329—194)

This invention relates to a combined amplitude detector and low impedance line driver amplifier. Feedback loops provide linearity and limiting of the output. The detector is encompassed in the feedback circuit and "floats" above ground potential. The circuit provides component protection against overdriving component failure, tube removal and short circuiting of the output. The circuit provides rapid recovery from high level pulses making it ideally suited for use in pulse radar systems. Thus, useful output may now be obtained from weak signals closely following in time a strong signal. Heretofore, these weak signals have remained undetectable due primarily to the inability of the conventional detector, returned to ground, to be a source sufficiently low in impedance for rapid direct current restoration. Also in prior circuits the coupling capacitor, coupling the detector to the following circuitry, back biased the detector after a strong signal further curtailing the detector's ability to detect weak signals immediately following strong signals. The direct coupled floating detector herein disclosed solves this direct current restoration problem and in addition makes feasible the use of encompassing feedback for linearity and limiting.

It is, therefore, an object of the present invention to provide a detector-line driver that has a fast recovery time from all signals.

Another object of this invention is to provide a detector-line driver that has a linear output.

Another object of this invention is to provide a detector-line driver that has an output voltage that is limited to a predetermined level.

Another object of this invention is to provide a detector-line driver that affords a high degree of component protection.

Another object of this invention is to provide a detector-line driver with a low output impedance suitable for driving a low impedance transmission line.

Other objects and advantages of the present invention will be readily appreciated as the same becomes better understood by reference to the following detailed description considered with the accompanying drawing.

The drawing is a schematic diagram showing an embodiment of the present invention.

Referring to the embodiment of the invention illustrated in the drawing, the signal input 11 may be taken from the plate of the vacuum tube of the preceding stage. When this invention is practiced with a pulse radar system the preceding stage would typically be the last IF stage of the IF strip. The input circuit including capacitor 17 and impedance 63 may be tuned (peaked) in the conventional manner by a variable inductor as shown on the drawing, or if broad band operation is desired the inductor may be replaced by a resistor. These techniques of coupling the input of one stage to a preceding stage to obtain various amounts of gain or bandwidth are well known in the art and need not be further detailed as the operation of this invention is not dependent on these techniques. Detector 13 may be a conventional diode rectifier. It rectifies the incoming signal and develops the rectified envelope of the signal wave across signal developing capacitor 15, thus detecting the input signal. Coupling capacitor 17 isolates the direct current voltage level of this circuit from the preceding stage. Parallel capacitors 19 and 21 consist of one large direct current storage capacitor, e.g., 19 and one small bypass condenser, e.g., 21. The bypass capacitor offers a low impedance to the signal and places the input signal ground on both sides of capacitor 19. Of course, if capacitor 19 were a perfect capacitor at all frequencies, capacitor 21 would not be needed.

For explanatory purposes only in setting forth the analysis of the circuit of this invention specific values of components, and circuit operating parameters will be enumerated. It is understood that different components including the vacuum tubes and the rectifiers may be utilized depending upon the voltages, currents, and impedances that are desired. Such variations will be made by persons skilled in the art and will not depart from within the scope of this invention.

To understand the operation of the circuit it will be helpful to examine the direct current potentials throughout the circuit while it is in the quiescent state, and that is easiest by starting with the triode cathode follower vacuum tube output stage and output circuit. If it is arbitrarily decided that it is desired to have a circuit having a video output limited to two volts driving into an external impedance of seventy-five ohms at output jack 25, the following components and operating characteristics would be typical. Vacuum tube 23 could be both triode sections connected in parallel of a type 5687. The B+ supply would be approximately 150 volts and plate resistor 27 could be approximately 750 ohms. The purpose of this resistor is to limit the current flow in the circuit to a safe value in the situation of a short circuit on the output, or in the case of internal breakdown within the vacuum tube.

Zener diode 29 may be a type IN429 having approximately a six-volt operating characteristic. Thus the cathode of tube 23 is positioned six volts above the output voltage, both in respect to direct current voltage potential and in respect to signal voltage. Resistors 31 and 33 form a voltage divider, connected in parallel with the zener diode 29, defining a reference voltage having a difference level constant in voltage magnitude from the output voltage and the cathode of cathode follower 33. In this particular embodiment the reference voltage, i.e., the voltage across resistance 31, is made two volts by the proportioning of resistors 31 and 33. Unilateral diode 35 in feedback line 53 prevents the grid of vacuum tube 37 from being driven more negative than this reference voltage, hence limiting the output voltage to a predetermined amount. Resistor 45 provides circuit control if the external seventy-five ohm load should be removed from jack 25.

The feedback line 39 places the detector and input circuitry at the potential of the cathode of triode 23. Thus, in the quiescent condition, capacitors 15, 19, and 21 are all charged to the quiescent voltage existing at the cathode of triode 23.

Departing from the quiescent state an incoming signal removes positive charge from capacitor 15, i.e., driving it in a negative going direction. This tends to drive the grid of pentode vacuum tube 37 in a negative direction which results in the plate going positive and driving the grid of triode 23 in the positive direction. This raises the cathode of triode 23, which, in turn, raises the potential on the feedback line 39, which tends to raise the voltage on the grid of pentode 37. These potentials tend to offset each other through resistors 41 and 43, and maintain the grid of pentode 37 at substantially a constant potential affording a high degree of linearity. As in conventional feedback systems the magnitude of the departure from a constant potential is inversely proportional to the internal system gain. The overall gain of the device may thus be controlled by the ratio of the two resistors 41 and 43.

After the detection of a series of pulses, the magnitude of the positive potential charge in capacitor 15 has been lowered; this leaves it below the potential of the stored charge on capacitors 19 and 21. The charge on capacitor 15 is thus rapidly built back up to the quiescent value through a slight discharge of capacitor 19 through diode 51 and resistors 41 and 43. Typical values for capacitors 19 and 15 may be fifteen mfd. and sixty-eight mmfd., respectively. It is readily apparent that due to the tremendously larger energy storage of capacitor 19, compared to capacitor 15, that a very slight change in the charge of capacitor 19 would effect a change of several volts in the potential of the charge of capacitor 15.

Diode 47 shunted across the grid resistor of the conventional resistor-capacitance coupling network, 60 and 61, further aids in the rapid direct current restoration of the system by prohibiting the grid of triode 23 being driven negative at the time of cessation of signal on the grid of pentode voltage amplifier 37. (The series grid resistor 62 is a conventional grid current limiting resistor. It may be omitted. The use of such a resistor is generally considered good practice, in the art, to prevent the destruction of the associated tube in instances of malfunctions.) The grid of cathode follower 23 would otherwise go negative at this time due to the dropping of the plate potential in the voltage amplification stage as its grid is returned to its quiescent potential, a more positive value. Those skilled in the art will readily determine the appropriate values of the capacitor 61 and resistor 60 depending on the frequency characteristics of the signals to which this invention is applied. The particular values used for these components, and the protective resistor 62, depends upon other considerations than the functioning of this invention.

To further illustrate the particular embodiment of this invention being enumerated the following additional parameters may be helpful. As previously stated the signal output at jack 25 has a peak-to-peak swing of two volts, or looking at it a little differently, a no signal to maximum signal swing of two volts. This voltage swing is accomplished by the voltage at jack 25, with a seventy-five ohm external load in place, moving from 0.75 volt direct current above ground in the quiescent state (10 milliamperes flowing through the load) to 2.75 volts peak at maximum signal output. With the value of resistor 45 at four-hundred-seventy ohms the rise in voltage if the load becomes disconnected from jack 25 will not exceed ten volts. This furnishes component protection from faulty operation. In this embodiment vacuum tube 37 of the voltage amplification stage is a type 5654. Cathode resistor 49 biases the cathode of pentode 37 to approximately 9.5 volts. Thus with the grid of pentode 37 at the voltage level of the cathode of triode 23, approximately 2.75 volts of grid-to-cathode bias is provided in the quiescent state.

Persons skilled in the art will make many modifications and variations of the present invention from the teachings herein. It is, therefore, to be understood that within the scope of the appended claim the invention may be practiced otherwise than as specifically described.

We claim:

The improvement in a detector-line driver system having signal input means; signal output means; an input signal; an output signal; a signal developing capacitor; a diode rectifier cooperating with the signal input means and the said signal developing capacitor for developing a rectified envelope of the input signal across the said capacitor; a vacuum tube voltage amplification stage, having at least a grid and a plate, cooperating with the said capacitor for amplifying the rectified envelope of the input signal; a triode cathode follower vacuum tube output stage having a grid, a cathode and a plate; and resistor-capacitor coupling means for coupling the grid of the cathode follower stage to the plate of the voltage amplification stage; the said improvement comprising: a zener diode cooperating with the cathode of the said cathode follower stage and the said output means for positioning the cathode of the cathode follower stage a determined voltage above the signal output means; resistor voltage divider means connected in parallel with the said zener diode for providing a reference voltage having a difference level constant in magnitude from the output voltage and from the cathode voltage of the said cathode follower stage; diode means cooperating with the said voltage divider and the grid of the said vacuum tube voltage amplification stage for preventing the grid of the said voltage amplification stage from being driven more negatively than the said reference voltage, and limiting the said output signal to a predetermined value; a capacitor for energy storage having larger energy storage capacity than the said signal developing capacitor; connecting means cooperating with the cathode of the said cathode follower stage, the signal input means and the said capacitor for energy storage for placing the signal input means and the charge voltage on the large energy storage capacitor at the quiescent voltage of the cathode of the said cathode follower stage; and means including a diode cooperating with the capacitor for energy storage and the grid of the said voltage amplification stage for maintaining the voltage on the grid of the voltage amplification stage at substantially a constant voltage.

References Cited by the Examiner

UNITED STATES PATENTS

| | | | |
|---|---|---|---|
| 3,134,078 | 5/1964 | Holmes | 330—199 |
| 3,247,464 | 4/1966 | Morrison | 330—138 |

ROY LAKE, *Primary Examiner*.

ALFRED L. BRODY, *Examiner*.